(12) United States Patent
Johnson (10) Patent No.: US 7,511,651 B1
(45) Date of Patent: Mar. 31, 2009

(54) INTERFACE FOR MULTIPLE RECEIVERS AND A RESISTOR LADDER

(75) Inventor: Wade G. Johnson, Oxford, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 16 days.

(21) Appl. No.: 11/852,471

(22) Filed: Sep. 10, 2007

(51) Int. Cl.
*H03M 1/12* (2006.01)

(52) U.S. Cl. .................. 341/155; 340/870.13

(58) Field of Classification Search .......... 341/155; 340/870.13, 870.16, 870.41; 307/10.1
See application file for complete search history.

(56) References Cited

U.S. PATENT DOCUMENTS 6,762,693 B2 * 7/2004 Wand .................... 340/870.13

* cited by examiner

*Primary Examiner*—Rexford Barnie
*Assistant Examiner*—Joseph Lauture (57) ABSTRACT

An apparatus is provided for a switching interface for a first receiver, a second receiver, and a resistor ladder. A first terminal is coupled to a first resistor of the resistor ladder. A second terminal is coupled to the first resistor. A third terminal is coupled to a reference voltage. A switch has a first state coupling the first terminal to the third terminal and a second state coupling the second terminal to the third terminal. A first analog-to-digital (A/D) converter is coupled to the resistor ladder and the first receiver. The first A/D is configured to compare a first voltage with a second voltage to determine if the switch is positioned in the first state or the second state. A second analog-to-digital (A/D) converter is coupled to the resistor ladder and the second receiver and also configured to perform a voltage comparison.

20 Claims, 6 Drawing Sheets

| | DUAL RECEIVER CIRCUIT VALUES [2 OR 3 SWITCH INPUTS OR STATES] | |
|---|---|---|
| SWITCH ASSM. | DA | 1n4148 OR EQUIVALENT |
| | R1A[Ω] | 158 |
| | R2[Ω] | 1070 |
| | R1B[Ω] | 158 |
| | DB | 1n4148 OR EQUIVALENT |
| | Rswitch[Ω] | <=100 |
| RECEIVER | Rpu[Ω] | 280 |
| | Rpd[Ω] | 49.9k |
| | Rad[Ω] | 10.0k |
| | Rpu_sw[Ω] | 0-10 |
| | Cad[nF] | 100 |
| | Cin[nF] | 10 |
| SYSTEM | Ropen[Ω] | >=100k |
| | Rharness[Ω] | <=1 |
| | Rshort[Ω] | <=100m |
| | Vshort [V] | <=1 |
| | GND RETURN | no(+/- 1V) |
| | Inom at Max R[mA] | 12.4 |

FIG. 3B

| | DUAL RECEIVER CIRCUIT VALUES [2 OR 3 SWITCH INPUTS OR STATES] | |
|---|---|---|
| SWITCH ASSM. | DA | 1n4148 OR EQUIVALENT |
| | R1A[Ω] | 887 |
| | R2[Ω] | 3920 |
| | R1B[Ω] | 887 |
| | DB | 1n4148 OR EQUIVALENT |
| | Rswitch[Ω] | <=20 |
| RECEIVER | Rpu[Ω] | 1620 |
| | Rsh[Ω] | 33.2k |
| | Rslo[Ω] | 7.68k |
| | Rvhi[Ω] | 33.2k |
| | Rvlo[Ω] | 7.68k |
| | Rpu_sw[Ω] | 0-10 |
| | Cad[nF] | 33 |
| | Cin[nF] | 10 |
| SYSTEM | Ropen[Ω] | >=100k |
| | Rharness[Ω] | <=1 |
| | Rshort[Ω] | <=100m |
| | Vsupply [V] | 6-26 |
| | Vshort [V] | <=1 |
| | GND RETURN | no(+/- 1V) |
| | Inom at Max R[mA] | 6.21 |

DUAL RECEIVER SWITCH STATES AND CALIBRATIONS
[2 OR 3 SWITCH INPUTS OR STATES]

| Receiver A without Deadbands | Receiver B without Deadbands | NOTE ON REVERSE LOGIC: | Receiver A with Deadbands | Receiver B with Deadbands |
|---|---|---|---|---|
| A Short GND(1) | B Short GND (1) | * Position 1 is between different calibrations comparing receiver A and receiver B. | A Short GND(1) | B Short GND (1) |
| 1.206 | 1.206 | | 1.118 | 1.118 |
| Position 1 | Position 2 | | 1.294 | 1.294 |
| 3.716 | 3.716 | | Position 1 | Position 2 |
| Position 2 | Position 1 | NOTE ON SHORT/OPEN: | 3.627 | 3.627 |
| 4.686 | 4.686 | * Short and open do not have different calibrations | 3.804 | 3.804 |
| A OPEN/Batt (2) | B OPEN/Batt(2) | * Short or Open on receiver A does not interupt receiver B, vice versa. | Position 2 | Position 1 |
| | | | 4.588 | 4.588 |
| | | | 4.784 | 4.784 |
| | | | A OPEN/Batt (2) | B OPEN/Batt(2) |

*Calibrations without deadbands recommended. Better Separation with 1V GND offset.*

Example for Receiver A resistor ladder interface: IF

| | | |
|---|---|---|
| 0.000 <= voltage < 1.206 | Then | A Short GND(1) |
| 1.206 <= voltage < 3.716 | Then | Position 1 |
| 3.716 <= voltage < 4.686 | Then | Position 2 |
| 4.686 <= voltage < infinity | Then | A OPEN/Batt(2) |

STATES AND A/D COUNT RATIO CALIBRATIONS (1) This signal range represents short circuit to GND on receiver signal.
(2) This signal range represents an open circuit or signal short to battery. May represent switch position 3 for open switch contact.

*FIG. 4A*

STATES AND A/D COUNT RATIO CALIBRATIONS

DUAL RECEIVER SWITCH STATES AND CALIBRATIONS
[2 OR 3 SWITCH INPUTS OR STATES]

| Receiver A without Deadbands | Receiver B without Deadbands | NOTE ON REVERSE LOGIC: | Receiver A with Deadbands | Receiver B with Deadbands |
|---|---|---|---|---|
| A Short GND(1) 0.238 | B Short GND (1) 0.238 | * Position 1 is between different calibrations comparing receiver A and receiver B. | A Short GND(1) 0.228 0.238 | B Short GND (1) 0.228 0.238 |
| Position 1 0.630 | Position 2 0.630 | | Position 1 0.630 0.640 | Position 2 0.630 0.640 |
| Position 2 0.874 | Position 1 0.874 | NOTE ON SHORT/OPEN: * Short and open do not have different calibrations * Short or Open on receiver A does not interrupt receiver B, vice versa. | Position 2 0.869 0.879 | Position 1 0.869 0.879 |
| A OPEN/Batt (2) | B OPEN/Batt(2) | | A OPEN/Batt (2) | B OPEN/Batt(2) |

*Calibrations without deadbands recommended.*
*Better Separation at 6V and 1V GND offset.*

Example for Receiver A resistor ladder interface: IF

| | | |
|---|---|---|
| 0.000 < =a/d ratio< 0.238 | Then | A Short GND(1) |
| 0.238 < =a/d ratio< 0.630 | Then | Position 1 |
| 0.630 < =a/d ratio< 0.874 | Then | Position 2 |
| 0.874 < =a/d ratio< infinity | Then | A OPEN/Batt(2) |

*FIG. 4B*

STATES AND VOLTAGE RATIO CALIBRATIONS

DUAL RECEIVER SWITCH STATES AND CALIBRATIONS
[2 OR 3 SWITCH INPUTS OR STATES]

| Receiver A without Deadbands | Receiver B without Deadbands | NOTE ON REVERSE LOGIC: | Receiver A with Deadbands | Receiver B with Deadbands |
|---|---|---|---|---|
| A Short GND(1) | B Short GND (1) | * Position 1 is between different calibrations comparing receiver A and receiver B. | A Short GND(1) | B Short GND (1) |
| 0.238 | 0.238 | | 0.228 | 0.228 |
| Position 1 | Position 2 | | 0.238 | 0.238 |
| 0.630 | 0.630 | | Position 1 | Position 2 |
| Position 2 | Position 1 | NOTE ON SHORT/OPEN: | 0.630 | 0.630 |
| 0.874 | 0.874 | * Short and open do not have different calibrations | 0.640 | 0.640 |
| A OPEN/Batt (2) | B OPEN/Batt(2) | * Short or Open on receiver A does not interrupt receiver B, vice versa. | Position 2 | Position 1 |
| | | | 0.869 | 0.869 |
| | | | 0.879 | 0.879 |
| | | | A OPEN/Batt (2) | B OPEN/Batt(2) |

*Calibrations without deadbands recommended. Better Separation at 6V and 1V GND offset.*

Example for Receiver A resistor ladder interface: IF

| | | |
|---|---|---|
| 0.000 <=V ratio< 0.238 | Then | A Short GND(1) |
| 0.238 <=V ratio< 0.630 | Then | Position 1 |
| 0.630 <=V ratio< 0.874 | Then | Position 2 |
| 0.874 <=V ratio< infinity | Then | A OPEN/Batt(2) |

FIG. 4C

INTERFACE FOR MULTIPLE RECEIVERS AND A RESISTOR LADDER

TECHNICAL FIELD

The present invention generally relates to resistor ladder networks, and more particularly relates to an interface for multiple receivers and a resistor ladder for use in a vehicle.

BACKGROUND OF THE INVENTION

Resistor ladder networks typically comprise a plurality of resistors and a plurality of switches disposed such that closing any one of the switches alters either the high resistance or the low resistance of a voltage divider circuit. The voltage divider circuit is comprised of a high resistance between a supply voltage and an output terminal and a low resistance between the output terminal and a low voltage reference. The resistor ladder is substituted for either the high resistance or low resistance in the voltage divider network. In this way, the resistance of the network is a variable and will exhibit a unique resistance range depending upon the selected state of the switch. Thus, the output voltage of the voltage divider is indicative of that, if any, of the switches are closed (e.g., user switch selection). Resistor ladder networks are increasingly used in vehicular applications due to their flexibility of implementation and cost savings.

In certain vehicular applications, more than one electronic module receiver may require knowledge from a particular switch state. For example, in hybrid vehicles, a hybrid control module may use a hood state (e.g., whether the hood of the vehicle is open or closed) in order to disable a high voltage source for safety. In addition, a body control module may simultaneously use the hood state for theft deterrent and remote start functions.

One possible solution is to have the first module read the respective switch state, and then transmit the state over a data bus to the second module. An alternative solution may involve the use of duplicate switches or switching networks (e.g., one switch or switching network per electronic module). However, both of these solutions add unneeded cost and complexity.

Accordingly, it is desirable to implement a solution for multiple electronic module receivers without the drawbacks of other solutions described above. In addition, it is desirable to incorporate resistor ladder functionality into such a proposed solution. Furthermore, other desirable features and characteristics of the present invention will become apparent from the subsequent detailed description and the appended claims, taken in conjunction with the accompanying drawings and the foregoing technical field and background.

SUMMARY OF THE INVENTION

An apparatus is provided for a switching interface for a first receiver, a second receiver, and a resistor ladder. A first terminal is coupled to a first resistor of the resistor ladder. A second terminal is coupled to the first resistor. A third terminal is coupled to a reference voltage. A switch has a first state coupling the first terminal to the third terminal and a second state coupling the second terminal to the third terminal. A first analog-to-digital (A/D) converter is coupled to the resistor ladder and the first receiver. The first A/D is configured to compare a first voltage with a second voltage to determine if the switch is positioned in the first state or the second state. A second analog-to-digital (A/D) converter is coupled to the resistor ladder and the second receiver. The second A/D is configured to compare the first voltage with the second voltage to determine if the switch is positioned in the first state or the second state.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

A switching interface may be implemented as will be described to alleviate the need for busses or duplicate switches in automotive applications. The switching interface includes at least two receiver modules that can supply or receive a voltage, and interpret the supplied or received voltage as a particular switch state. To interpret the supplied or received voltage, the receiver modules may compare a reference voltage with a voltage drop as a result of a particular position of a switch assembly. A set of various ranges, such as voltage comparison ranges, may be indicative of a switch position of the switch assembly. The switch assembly may be configured between the interfaces to be independently operable from each receiver. Diodes, placed in series between each receiver and the switch assembly, prevent the flow of current from the opposing receiver, respectively. The switch assembly may be coupled between the receivers and a common terminal that can be either a ground reference or a voltage supply reference as will be further described. The switching interface allows a single switch assembly to independently control two systems, alleviating the need for additional hardware.

Figures 1A, 1B, 1C:
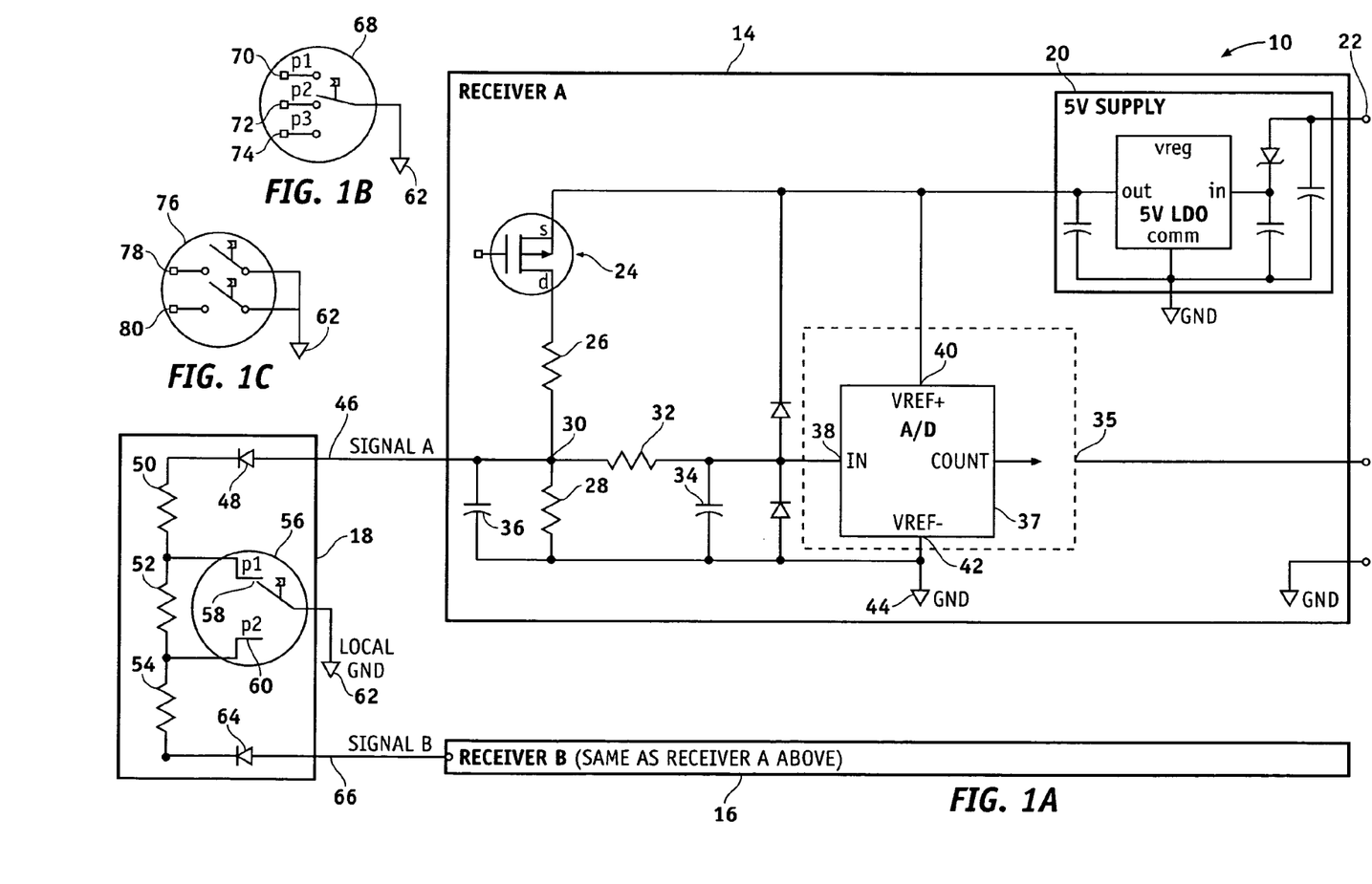
FIG. 1A is a schematic diagram of an exemplary dual receiver resistor ladder interface with a first exemplary switch for use in a switch assembly.
FIG. 1B is a second exemplary switch for use in a switch assembly of the interface.
FIG. 1C is a third exemplary switch for use in the switch assembly of the interface.

FIG. 1A illustrates an exemplary dual receiver regulated five volt (5V) resistor ladder interface 10 in a schematic diagram, that can be deployed in a vehicle. As one skilled in the art will appreciate, various supply voltages (e.g., three volts), whether they be constant or variable, are also contemplated. The ladder interface 10 includes a resistor ladder switch assembly 18 coupled to two receiver modules 14 and 16 that perform voltage comparisons to determine a respective position of an incorporated switch 56 or switches in the ladder network (e.g., resistors 50, 52 and 54). The receiver modules 14 and 16 include controllers 35 that use analog to digital (A/D) conversion to perform the respective voltage comparisons. The voltage comparisons compare an input voltage (regulated in the instant case) with a voltage across the ladder network (e.g., resistors 50, 52 and 54). Depending on the voltage seen, a series of predetermined switch 56 positions can be registered in the controller 35 of either receiver module 14 and 16. For example, the aforementioned hood state can be read by a receiver/controller that performs theft deterrent functionality or remote start functionality, and simultaneously by another receiver/controller that performs high voltage functionality. The two receivers are electrically isolated from each other via the ladder network described below.

The illustrated interface 10 has been optimized and is cost-effective to implement. In the depicted embodiment two electronic receiver/controller modules 14 and 16 are depicted. A 5V voltage supply regulator device 20 is integrated into each of the receiver or controller modules 14 and 16, that receives an input voltage through terminal 22. The input voltage may be a supply voltage comprising the battery of a conventional twelve volt automotive electrical system. The supply voltage is then delivered through a supply switch 24 and through pull up resistor 26 to node 30. Node 30 is electrically connected (denoted as reference 46) to an input/output terminal of switch assembly 18.

As will be described, switch assembly 18 provides electrical connectivity to both receiver module 14 and receiver module 16. Switch assembly 18 also provides electrical isolation of module 14 from module 16 through the use of diodes 48 and 64. Each module 14 and 16 is configured, through switch assembly 18, to be isolated independent of the status of the respective module (e.g., available, not available, open, or short), as will be further described. Each receiver 14 and 16 gets a valid input signal whether the other receiver is present, absent, short circuited, or disconnected (open). Thus, each receiver 14 and 16 is independent of the other receiver.

Switch assembly 18 includes two diodes 48 and 64 that serve to isolate receivers 14 and 16 respectively. Diode 48 is coupled to resistor 50 and positioned to prevent current from receiver 16 from traveling to receiver 14. Similarly, diode 64 is positioned to prevent current from receiver 14 from traveling to receiver 16. In additional embodiments, resistors 50 and 54 may be positioned between the receivers 14 and 16 and the diodes 48 and 64. In either embodiment, the diodes 48 and 64 are coupled in series with resistors 50 and 54, respectively.

A switch 56 is placed across resistor 52. A terminal of the switch 56 is coupled to a common connection. In the depicted embodiment, this common connection is a local ground 62. In other embodiments, the common connection may be a voltage supply reference, in that the diodes 48 and 64 would be reversed. Switch 56 is a two position switch (denoted by reference numbers 58 and 60). In one example operation, when switch 56 is in position 58, current flows through from node 30 through the diode 48 and resistor 50, through the switch 56 and to ground 62. Current also flows through conductor 66 from Receiver 16, through diode 64 and through resistors 54 and 52, through switch 56 to ground 62.

So that each receiver 14 and 16 may interpret the differences in voltages when switch 56 is in position 58 or position 60, conductor 46 is coupled to an input/out terminal of receiver 14, and conductor 66 is coupled to an input/output terminal of receiver 16. As shown, receiver 14 includes a processor 35 that may include an analog to digital (A/D) converter 37. A/D converter 37 is coupled to the switch assembly 18 through an RC network, including resistors 28, and capacitors 34 and 36. An input terminal of converter 37 compares the input voltage against positive and negative voltage references 40 and 42 (in this case, +/−5V), that is also coupled to ground 44.

Converter 37 receives the input voltage and voltage reference values, converting them to a digital signal suitable for processor 35. Processor 35 utilizes the digital representations of the input voltage relative to the voltage reference values to determine a voltage compensation ratio indicative of a switch 56 position as further described below. A particular switch 56 position corresponds to a particular voltage compensation ratio observed by the converter 37. For example, returning to FIG. 1A, if switch is in position 1, a voltage compensation ratio (e.g., the ratio of the reference voltage to the voltage seen across the ladder network) will be registered by each receiver module. The module compares the ratio seen at a particular instant in time with a ratio range stored in memory to determine that the switch is in position 1.

Receiver 16 may include substantially the same subcomponents as found in receiver 14, including a 5V supply, an RC network, and an A/D converter (all not shown). As each receiver 14, and 16 are completely isolated from each other via the switch assembly diodes 48 and 64, receiver 14 can determine voltage ratios indicative of the switch 56 position without regard to a status of receiver 16, and vice-versa.

The depicted interface 10 as shown in FIG. 1A facilitates detection of up to two switch positions, and in other embodiments, detection of up to three switch positions, depending that type of switch is utilized. An exemplary switch assembly 68 having three switch positions 70, 72, and 74 is illustrated in FIG. 1B. Switch assembly 68 includes an open circuit contact for three positions. In the depicted embodiment, an output terminal of the switch 68 is coupled to ground 62, but can also be coupled to a common connection 62 such as a voltage supply reference. In addition, switch assembly 76 as shown in FIG. 1C illustrates a third such exemplary embodiment of a switch assembly 76, where two switches 78 and 80 are coupled in parallel to ground 62.

Returning to FIG. 1A, interface 10 includes three resistors (e.g., resistors 50, 52, and 54) and depending on the switch apparatus utilized (FIGS. 1B, 1C) provides for detection of (a) up to two switch states (e.g., ground short circuit, and a combined open circuit with battery+(B+) short circuit), and (b) up to three switch states (e.g., ground short circuit, and a combined open circuit/switch inactive with B+ short circuit, using one switch state as open circuit eliminating open and short B+ detection). Interface 10 allows for a combined state of an open circuit and a short circuit to B+ voltage on a signal line (e.g., conductors 46 and 66).

Interface 10 robustly tolerates variation in system resistances due to network components, such as increases in the switch resistances over time. For example, the switch assembly 18 maximum contact resistance may accommodate technical requirements in particular implementations of up to 100 ohms. The receiver pull-up resistor power switch resistance (switch 24) may range from zero ohms to 10 ohms. Harness resistance may vary between zero to one ohm. The harness resistance is in addition to the switch assembly resistance and the power switch resistance. In one embodiment, interface 10 may have switch currents ranging from about 1 mA to 15 mA when shorted to ground. In addition, interface 10 robustly tolerates short circuit voltages, while remaining operational. For example, in one embodiment, receivers 14 and 16 tolerate short circuit voltages of up to one volt while still registering appropriate failure mode states. Position 58 (first position) of the switch 56 gives highest priority to receiver module 14.

Similarly, position 60 (second position) of the switch 56 gives highest priority to receiver module 16.

Figure 2:
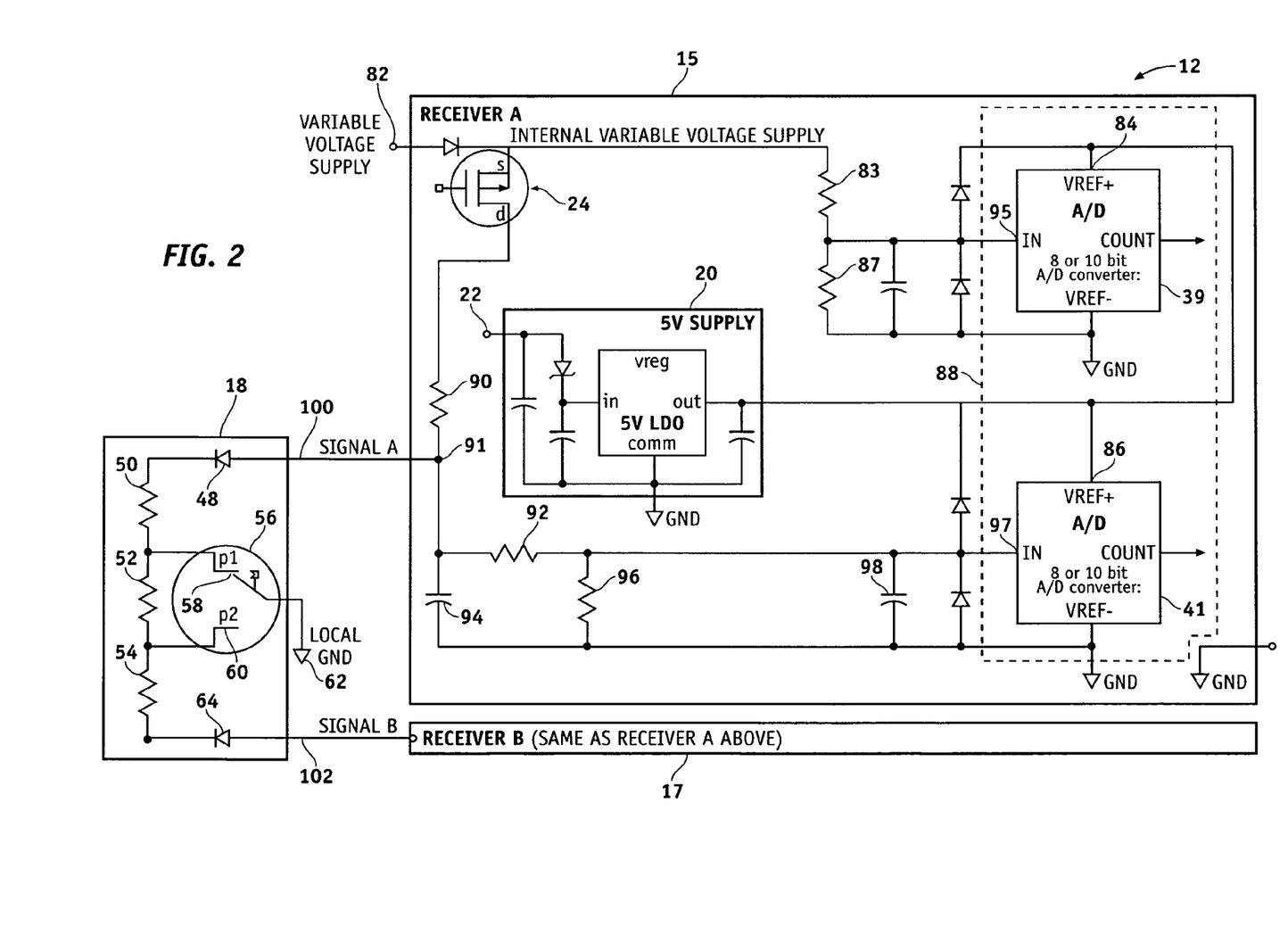
FIG. 2 is a schematic diagram of a second exemplary dual receiver resistor ladder interface.

Turning to FIG. 2, an exemplary dual receiver variable voltage (12V) low side resistor ladder interface 12 is illustrated in a schematic diagram, that can again be deployed in a vehicle. Interface 12 includes a first receiver/controller module 15 and a second receiver/controller module 17. A variable voltage supply 82 is coupled to a switch 24, and then coupled through resistors 83 and 87 to an input terminal 95 of an A/D converter 39. A 5V supply 20 regulates an input voltage 22, that is then supplied to the positive voltage reference terminals 84 and 86 of A/D converter 39 and A/D converter 41, respectively. Converters 39 and 41 are again operated by use of a processor component 88, in that the converters 39 and 41 are integrated or separate from.

Receivers 15 and 17 are coupled in a similar manner to switch assembly 18 through conductors 100 and 102 as shown. Signal conductor 100 is coupled to a node 91, and through a pick up resistor 90 to the switch 24. Here, as before, switch assembly 18 includes a two position switch 56 (having positions 58 and 60), with diodes 48 and 64 to respectively isolate receivers 15 and 17 from each other, and three resistors 50, 52 and 54. Again, switch 56 is connected across resistor 52, and coupled to a common connection, in this case ground 62. Connection 62 can again include a voltage supply reference.

Lead 100 is coupled through a similar RC network as receivers 14 and 16, that includes resistor 92, and capacitor 94, resistor 96 and capacitor 98. An input terminal 97 of the second A/D converter 41 receives an input voltage of the RC network, and compares the voltage against the positive voltage reference terminal voltage 86 in a manner similar to receivers 14 and 16.

Interface 12 as depicted in FIG. 2 can also incorporate the switch assemblies 68 as shown in FIG. 1B and 76 as shown in FIG. 1C, where a three position switch 68 can be coupled in parallel with resistor 52, or two independent switches 76 can be coupled in parallel with resistor 52. In both cases, a terminal of the switch or switches is coupled to a common connection 62 such as ground.

Like interface 10, interface 12 allows for the detection of up to two switch 56 positions with the switch 56 connected to a local ground 62 or the detection of three switch 68 positions (FIG. 1B) with the switch 68 connected to a local ground 62. Both interfaces 10 and 12 robustly allow for a so-called "local ground offset" voltage to vary between plus and minus one volt. This means that a receiver 14, 15, 16, or 17 can be coupled to ground at a particular location in the vehicle, while the switching apparatus may be coupled to ground at another location in the vehicle, and that the interfaces 10 and 12 may continue to be operational even though local voltages seen in the receiver or the switch vary between plus and minus one volt.

Like interface 10, interface 12 includes three resistors (e.g., resistors 50, 52, and 54), providing for detection of (a) up to two switch states (ground short circuit, and a combined open circuit with B+short circuit), and (b) up to three switch states (ground short circuit, and a combined open circuit/switch inactive with B+ short circuit, again using one switch state as open circuit eliminating open and short B+ detection). In one embodiment, interface 12 has switch currents ranging from about 1 mA to 15 mA when shorted to ground.

Again, as seen in interface 10, the switch assembly 18 can robustly accommodate various system resistances that may increase over time. The switch assembly 18 maximum contact resistance may accommodate requirements of up to 20 ohms. The receiver pull-up resistor power switch resistance (switch 24) may range from zero ohms to 10 ohms. Harness resistance may vary between zero to one ohm. Again, this harness resistance is in addition to the switch assembly resistance and the power switch resistance.

Figure 3A:
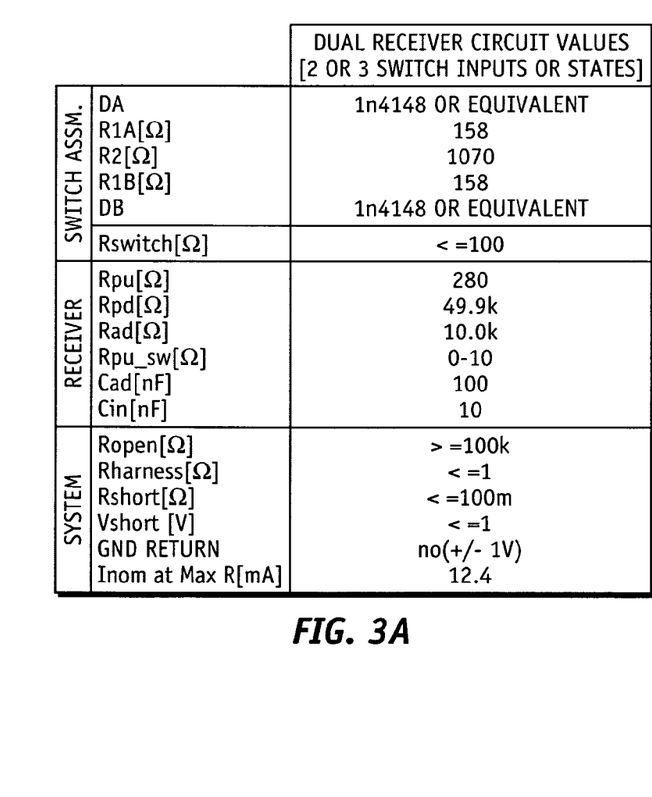
FIG. 3A illustrates exemplary circuit values for the interface depicted in FIG. 1A.

Turning to FIG. 3A, a table of exemplary circuit values for the dual receiver regulated 5 volt resistor ladder interface 10 depicted in FIG. 1A, is shown. FIG. 3A is segmented into three categories. Exemplary values for the switch assembly 18 are first illustrated. In one embodiment, diodes 48 and 64 may be high conductance fast diodes, p/n 1n4148 and supplied by Fairchild Semiconductor, Incorporated. Exemplary values of resistors 50 and 54 are about 158 ohms, while resistor 52 may be about 1070 ohms. The resistance of the switching device 56, 68, or 76 may be less than or equal to about 100 ohms.

On the receiver side, exemplary resistances include about 280 ohms for the pull-up resistor 26, about 50 kohms for the pull-down resistor 28, about 10 kohms for resistor 32, between about 0-10 ohms for the resistance of the switch 24, and capacitances of about 100 nanofarads for capacitor 34 and about 10 nanofarads for capacitor 36.

On the system side, exemplary resistances include greater than or equal to about 100 kohms for open circuit resistance (resistance seen in the system while a switch apparatus is open), less than or equal to about 1 ohm for harness resistance, and less than or equal to about 100 mohms for shorted resistance. The short circuit voltage allowance as previously described, appears as less than or equal to about one volt. Nominal current at maximum resistance is about 12 mA.

Figure 3B:
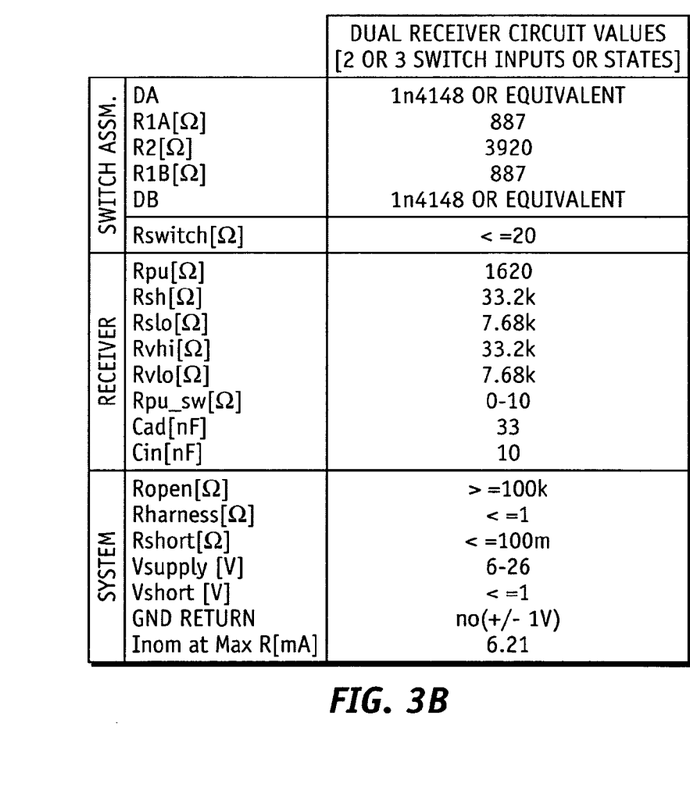
FIG. 3B illustrates exemplary circuit values for the interface depicted in FIG. 2.

Turning to FIG. 3B, a table of exemplary circuit values for the dual receiver variable voltage 12V low side resistor ladder interface 12 depicted in FIG. 2, is shown. Again, FIG. 3B is segmented into three categories. Exemplary values for the switch assembly 18 are first illustrated. In one embodiment, diodes 48 and 64 may be high conductance fast diodes, such as p/n 1n4148 supplied by Fairchild Semiconductor, Incorporated. Exemplary values of resistors 50 and 54 are about 887 ohms, while resistor 52 may be about 3920 ohms. The resistance of the switching device 56, 68, or 76 may be less than or equal to about 100 ohms.

On the receiver side, exemplary resistances include about 1620 ohms for the pull-up resistor 90, about 33 kohms for resistor 92, about 8 kohms for resistor 96, about 33 kohms for resistor 83, about 8 kohms for resistor 87, between about 0-10 ohms for the resistance of the switch 24, and capacitances of about 33 nanofarads for capacitor 98 and about 10 nanofarads for capacitor 94.

On the system side, exemplary resistances include greater than or equal to about 100 kohms for open circuit resistance, less than or equal to about 1 ohm for harness resistance, and less than or equal to about 100 mohms for shorted resistance. The variable supply voltage may vary between about 6 to about 26 volts. The short circuit voltage allowance as previously described, appears as less than or equal to about one volt. Nominal current at maximum resistance is about 6 mA.

Figure 4A:
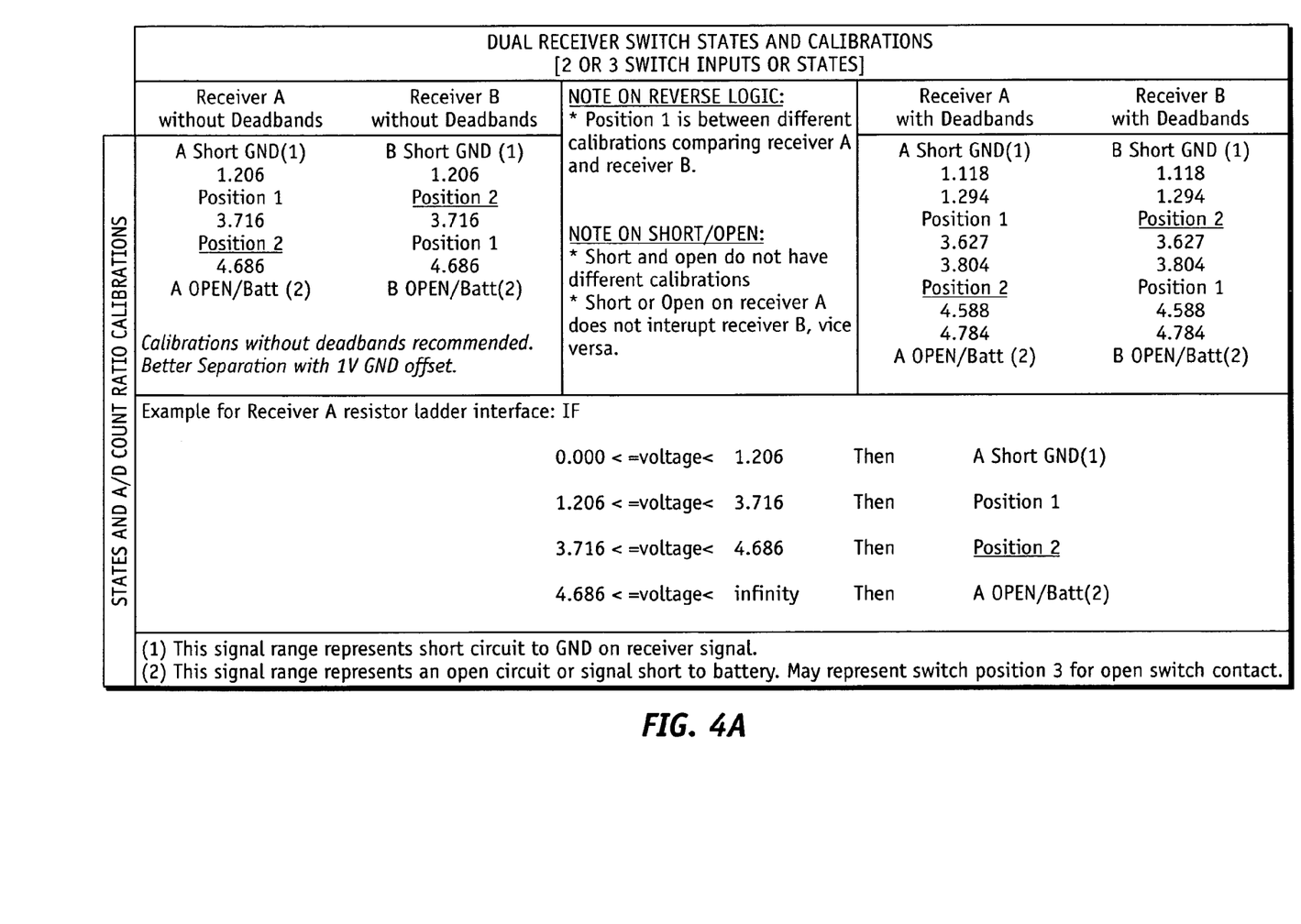
FIG. 4A illustrates exemplary dual receiver switch states and voltage calibrations for the interface depicted in FIG. 1A.

FIG. 4A illustrates a table of dual receiver switch states and voltage calibrations for the regulated 5 volt resistor ladder interface 10 depicted in FIG. 1A. As one skilled in the art will appreciate, the various switch states can be calibrated with or without so-called "deadband regions." Deadband regions are regions of the count ratio or voltage ratio that are configured so as not to indicate a switch state. The deadband regions are, as a result, "in-between" regions. The respective deadband regions can be flagged or set to a diagnostic code for a particular application. In other words, if a voltage or count ratio is observed in a deadband region, a flag or a diagnostic code may be sent to a technician so as to analyze the interface for errors. The calibrations are recorded in the processor 35, where the A/D converter 37 compares the input voltage received at terminal 38 with the reference voltage (in this case, 5V). An example comparison/respective switch state for receiver/controller 14 (FIG. 1A) is described in the lower portion of the table. If voltage determined by the processor 35 is determined to be between about zero and about 1 volt, then receiver/controller 14 registers a switch 56 in the A Short GND position. This signal range represents a short circuit to ground on the receiver signal. Similarly, if voltage is determined to be between about 1 and about 4 volts, then receiver/controller 14 registers a switch in position 1. If voltage is determined to be between about 4 and about 4 volts, then receiver/controller 14 registers a switch in position 2. Finally, if voltage is determined to be greater than about 5 volts, receiver/controller 14 registers a switch in the A OPEN/Batt position. This signal range represents an open circuit or signal short to battery. The signal range may also represent a switch position 3 for an open switch contact (in the case of a three-position switch). In a similar manner, the remaining count ratios are applied to receiver 14, including a configuration using deadband regions as seen. In addition, the same count ratios are applicable to receiver 16 (FIG. 1A).

Figure 4B:
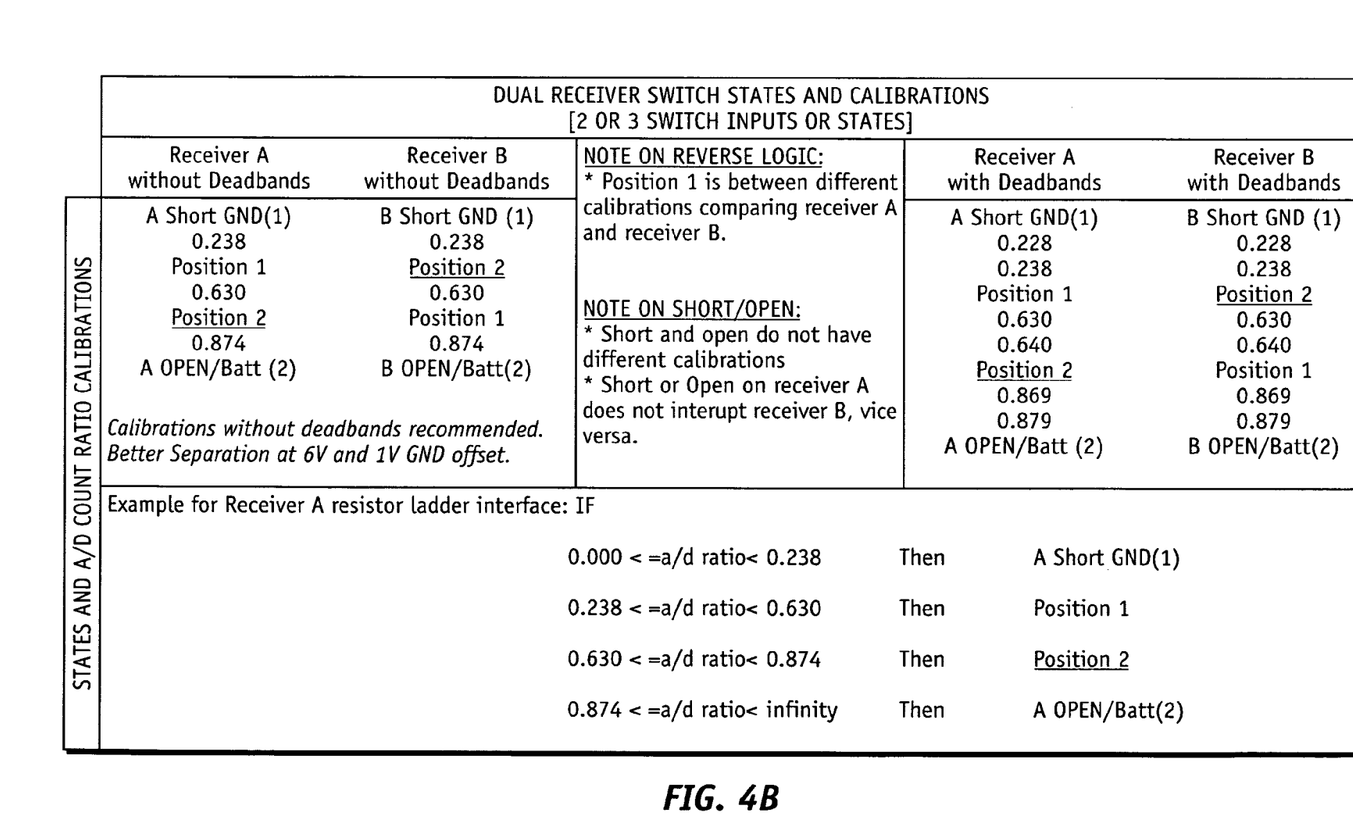
FIG. 4B illustrates exemplary dual receiver switch states and A/D count ratio calibrations for the interface depicted in FIG. 2.

FIG. 4B illustrates a table of dual receiver switch states and A/D count ratio calibrations for the dual receiver variable voltage 12V low side resistor ladder interface 12 depicted in FIG. 2. Again, the various switch states can be calibrated with or without deadband regions, that can be flagged or set to a diagnostic code for a particular application. The calibrations are recorded in the processor 88, where the A/D converters 39 and 41 compares the input voltage received at terminal 97 with the reference voltage at terminal 86 and the input voltage received at terminal 95 with the input voltage received at terminal 84. FIG. 4B illustrates exemplary A/D count ratios obtained by the converters 39 and 41, where the digital count of converter 41 is divided by the digital count of the converter 39 to determine a so-called "count ratio." An example comparison/respective switch state for receiver/controller 15 is described in the lower portion of the table. If the A/D count ratio determined by the processor 88 is determined to be between about zero and about 0.2, then receiver/controller 15 registers a switch in the A Short GND position. Again, this signal range represents a short circuit to ground on the receiver 15 signal. Similarly, if the count ratio is determined to be between about 0.2 and about 0.6, then receiver/controller 15 registers a switch in position 1. If the count ratio is determined to be between about 0.6 and about 0.9, then receiver/controller 15 registers a switch in position 2. Finally, if the count ratio is determined to be greater than about 0.9, receiver/controller 15 registers a switch in the A OPEN/Batt position. This signal range represents an open circuit or signal short to battery. Again, the signal range may also represent a switch position 3 for an open switch contact (in the case of a three-position switch). Again, in a similar manner, the remaining count ratios are applied to receiver 15 including a configuration using deadband regions as seen. Again, the same count ratios are applicable to receiver 17 (FIG. 2).

Figure 4C:
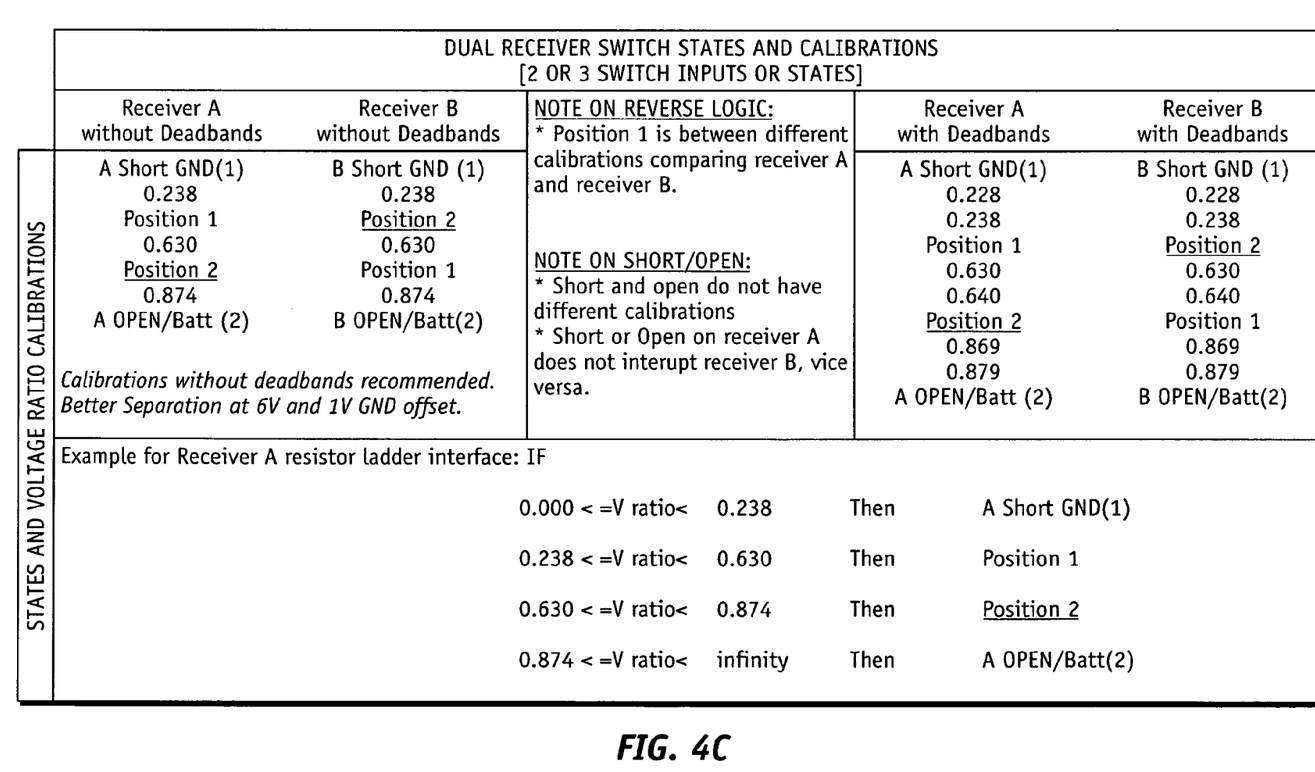
FIG. 4C illustrates exemplary dual receiver switch states and voltage calibrations for the interface depicted in FIG. 2.

FIG. 4C illustrates switch states and voltage ratio calibrations for the dual receiver variable voltage 12V low side resistor ladder interface 12 depicted in FIG. 2, again as seen with or without deadband regions. The calibrations are again recorded in the processor 88, where the A/D converters 39 and 41 compares the input voltage received at terminal 97 with the reference voltage at terminal 86 and the input voltage received at terminal 95 with the input voltage received at terminal 84 in a similar fashion to the comparison seen in FIG. 4B previously, but in a more simple fashion of comparing voltages. FIG. 4C illustrates the corresponding voltage ratio calibration obtained by the converters 39 and 41, where the voltage comparison of converter 41 is divided by the voltage comparison of the converter 39 to determine a so-called "voltage ratio." An example voltage comparison/respective switch state for receiver/controller 15 is described in the lower portion of the table. If voltage determined by the processor 88 is determined to be between about zero and 0.2 volts, then receiver/controller 15 registers a switch 56 in the A Short GND position. This signal range represents a short circuit to ground on the receiver signal. Similarly, if voltage is determined to be between about 0.2 and about 0.6 volts, then receiver/controller 15 registers a switch in position 1. If voltage is determined to be between about 0.6 and about 0.9 volts, then receiver/controller 15 registers a switch in position 2. Finally, if voltage is determined to be greater than about 0.9 volts, receiver/controller 15 registers a switch in the A OPEN/Batt position. This signal range represents an open circuit or signal short to battery. The signal range may also represent a switch position 3 for an open switch contact (in the case of a three-position switch). Again, in a similar manner, the remaining voltage ratios are applied to receiver 15, including a configuration using deadband regions as seen. Again, the voltage ratios are applicable to receiver 17 (FIG. 2).

By use of interfaces such as the depicted interfaces 10 and 12, each receiver/controller (e.g., controllers 15 and 17) can read the state of a switch. Each receiver/controller gets a valid input signal whether the other receiver is present, absent, short circuited, or disconnected (open). Thus, each receiver/controller is independent of the other receiver/controller. Implementations such as interfaces 10 and 12 can result in cost savings through part count reductions, wire harness savings, and engineering simplification. In addition, the system provides failure mode robustness, in that each of the receivers is completely isolated.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A switching interface for a first receiver, a second receiver, and a resistor ladder, comprising:
    a first terminal coupled to a first resistor of the resistor ladder;
    a second terminal coupled to the first resistor;
    a third terminal coupled to a reference voltage;
    a switch having a first state coupling the first terminal to the third terminal and a second state coupling the second terminal to the third terminal;
    a first analog-to-digital (A/D) converter coupled to the resistor ladder and the first receiver, the first A/D configured to compare a first voltage with a second voltage to determine if the switch is positioned in the first state or the second state; and
    a second analog-to-digital (A/D) converter coupled to the resistor ladder and the second receiver, the second A/D configured to compare the first voltage with the second voltage to determine if the switch is positioned in the first state or the second state.

2. The switching interface of claim 1, further including a fourth terminal coupled to the first resistor giving the switch a third state coupling the fourth terminal to the third terminal, the first and second A/D converters determining if the switch is positioned in the first, second, or third states.

3. The switching interface of claim 1, further including a second switch coupled in parallel with the first switch.

4. The switching interface of claim 3, further including a first diode coupled to the first terminal to isolate the first receiver from the second receiver.

5. The switching interface of claim 4, further including a second diode coupled to the second terminal to isolate the second receiver from the first receiver.

6. The switching interface of claim 5, wherein the first resistor is coupled in series with the first diode.

7. The switching interface of claim 6, further including a second resistor coupled in series with the second diode.

8. The switching interface of claim 7, further including a third resistor connected across the first and second terminals.

9. The switching interface of claim 8, wherein the third resistor is in electrical communication between the first receiver and the third terminal, or alternatively, in electrical communication between the second receiver and the third terminal depending upon whether the switch is in the first or the second state.

10. A switching interface for a first receiver, a second receiver, and a resistor ladder, comprising:
    means for coupling a first terminal to a first resistor of the resistor ladder;
    means for coupling a second terminal to the first resistor;
    means for coupling a third terminal to a reference voltage;
    means for coupling a fourth terminal to the first resistor;
    means for switching to a first state connecting the first terminal to the third terminal, a second state connecting the second terminal to the third terminal, and a third state connecting the fourth terminal to the third terminal;
    first means for converting analog-to-digital (A/D) coupled to the resistor ladder and the first receiver, the first means for converting A/D configured to compare a first voltage with a second voltage to determine if the switch is positioned in the first state, the second state, or the third state; and
    second means for converting analog-to-digital (A/D) coupled to the resistor ladder and the second receiver, the second means for converting A/D configured to compare the first voltage with the second voltage to determine if the switch is positioned in the first state, the second state, or the third state.

11. The switching interface of claim 10, further including means for coupling a first diode to the first terminal to isolate the first receiver from the second receiver.

12. The switching interface of claim 11, further including means for coupling a second diode to the second terminal to isolate the second receiver from the first receiver.

13. An automotive switching interface for a first receiver, a second receiver, and a resistor ladder, comprising:
    a first terminal coupled to a first resistor of the resistor ladder;
    a second terminal coupled to a second resistor of the resistor ladder;
    a third terminal coupled to a reference voltage;
    a third resistor connected across the first and second terminals;
    a switch having a first state coupling the first terminal to the third terminal and a second state coupling the second terminal to the third terminal;
    a first diode coupled to the first resistor;
    a second diode coupled to the second resistor;
    a first analog-to-digital (A/D) converter coupled to the resistor ladder and the first receiver, the first A/D configured to compare a first voltage with a second voltage to determine if the switch is positioned in the first state or the second state; and
    a second analog-to-digital (A/D) converter coupled to the resistor ladder and the second receiver, the second A/D configured to compare the first voltage with the second voltage to determine if the switch is positioned in the first state or the second state.

14. The switching interface of claim 13, wherein the first voltage is a five volt (5V) voltage supply.

15. The switch apparatus of claim 14, wherein the resistance of the first resistor is about 1100 ohms, and the resistance of the second and third resistors is about 160 ohms.

16. The switch apparatus of claim 14, wherein the resistance of the switch is about 100 ohms.

17. The switch apparatus of claim 13, wherein the first voltage is a 12 volt (12V) variable voltage supply.

18. The switch apparatus of claim 17, wherein the resistance of the first resistor is about 3900 ohms, and the resistance of the second and third resistors is about 890 ohms.

19. The switch apparatus of claim 17, wherein the resistance of the switch is about 20 ohms or less.

20. The switch apparatus of claim 13, wherein the reference voltage is associated with a supply voltage reference or a ground reference.

* * * * *